(12) United States Patent
Tucker et al.

(10) Patent No.: US 11,114,992 B2
(45) Date of Patent: Sep. 7, 2021

(54) MOTOR DRIVE WITH A FILTER INCLUDING A THREE-PHASE DIFFERENTIAL MODE REACTOR WITH COMMON MODE DAMPING

(71) Applicant: Schaffner EMV AG, Luterbach (CH)

(72) Inventors: Andrew Cecil Tucker, Victoria (AU); Luca Dalessandro, Zurich (CH); Jari Tapani Heininen, Nummi (FI)

(73) Assignee: Schaffner EMV AG, Luterbach (CH)

( * ) Notice: Subject to any disclaimer, the term of this patent is extended or adjusted under 35 U.S.C. 154(b) by 0 days.

(21) Appl. No.: 16/719,432

(22) Filed: Dec. 18, 2019

(65) Prior Publication Data

US 2020/0204140 A1    Jun. 25, 2020

(30) Foreign Application Priority Data

Dec. 21, 2018  (EP) .................... 18215512

(51) Int. Cl.
*H02P 1/00* (2006.01)
*H03H 7/01* (2006.01)
*H01F 27/24* (2006.01)
*H01F 27/28* (2006.01)
*H02P 27/04* (2016.01)

(52) U.S. Cl.
CPC ............ *H03H 7/01* (2013.01); *H01F 27/24* (2013.01); *H01F 27/28* (2013.01); *H02P 27/04* (2013.01)

(58) Field of Classification Search
CPC .......... H03H 7/01; H01F 27/24; H01F 27/33; H01F 27/28; H02P 27/04
See application file for complete search history.

(56) References Cited

U.S. PATENT DOCUMENTS

| | | | |
|---|---|---|---|
| 3,863,109 | A | 1/1975 | Emanuel et al. |
| 2010/0066474 | A1 | 3/2010 | Huang et al. |
| 2011/0241799 | A1 | 10/2011 | Wang et al. |
| 2020/0204058 | A1* | 6/2020 | Lindenberger .......... H02M 1/14 |

FOREIGN PATENT DOCUMENTS

| | | |
|---|---|---|
| DE | 102011086112 A1 | 5/2013 |
| EP | 2720357 A2 | 4/2014 |
| EP | 2998971 A1 | 3/2016 |
| EP | 2998971 A1 | 3/2019 |
| GB | 495370 | 11/1938 |
| JP | 2007181341 A | 7/2007 |
| JP | 2008300860 A | 12/2008 |

OTHER PUBLICATIONS

R. M. Tallam, et al., "Integrated Differential-Mode and Common-Mode Filter to Mitigate the Effects of Long Motor Leads on AC Drives", IEEE, 2010, pp. 838-845.

* cited by examiner

*Primary Examiner* — Karen Masih
(74) *Attorney, Agent, or Firm* — Blank Rome LLP

(57) ABSTRACT

Motor drive with a T-type filter with at least two three-phase differential mode reactors and three capacitors, wherein at least one of the three-phase differential mode reactor comprises an auxiliary coil (6) wound around three wound core elements (2.1, 2.2, 2.3) such that the common mode current is induced in the auxiliary coil (6).

15 Claims, 5 Drawing Sheets

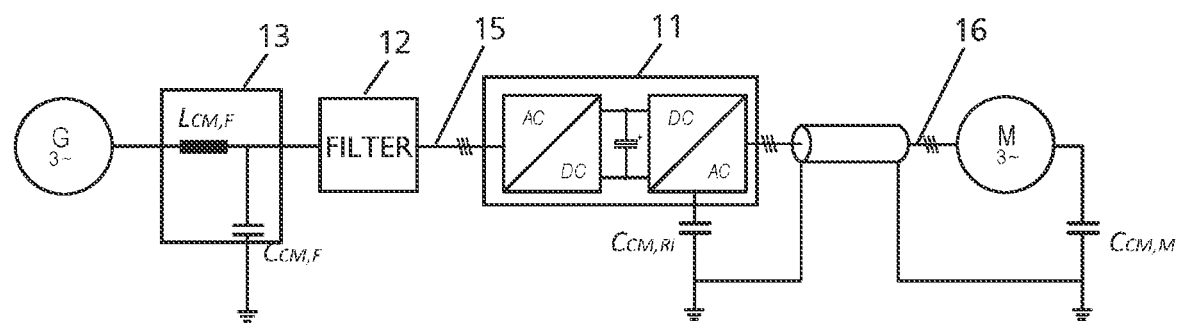
Fig. 1
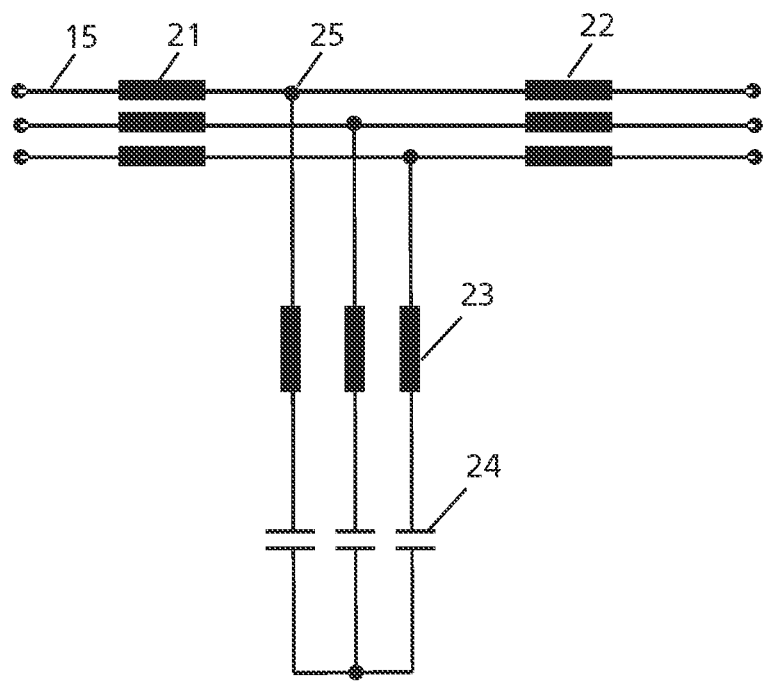
Fig. 2
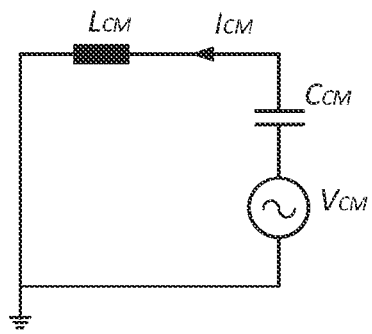
Prior Art  Fig. 3
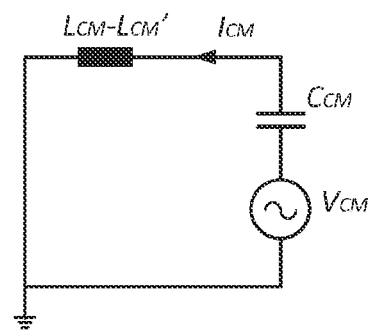
Fig. 4

MOTOR DRIVE WITH A FILTER INCLUDING A THREE-PHASE DIFFERENTIAL MODE REACTOR WITH COMMON MODE DAMPING

CROSS-REFERENCE TO RELATED APPLICATION

This application claims the benefit of European Patent Application No, EP18215512.7, filed Dec. 21, 2018, the entire disclosure of which is hereby incorporated by reference.

FIELD OF THE INVENTION

The present invention concerns a filter for combined common and differential mode filtering for a motor drive.

DESCRIPTION OF RELATED ART

Three phase motor drive systems inherently generate common mode noise current which circulates throughout the entire power train from supply to motor. The common mode noise current has typically fundamental period and high frequency ringing at 50 kHz. It thermally loads reactors and conductors and thus reduces their lifetime. This requires also to dimension the reactors larger than necessary to bear the common mode currents. The common mode noise currents wear also the isolation of the motor which could lead to motor defects.

In order to reduce the resonant ringing, bulky RC and RL damping techniques can be used which require additional space, increase costs and decrease the overall system efficiency, in particular for high power applications.

An RC damper is a series connection of a resistance and a capacitor between earth and for example the DC link, the motor cable or the motor. However, this requires robust high voltage capacitors which are complex, expansive and bulky. In addition, additional earth capacitors can have other undesired side effects.

DE29506951U1 suggests a current compensated common mode choke to filter the common mode currents. Also, this solution bulky and requires large, heavy and expansive additional chokes.

DE102011086112A1 discloses in one embodiment a two-phase differential mode reactor. The reactor comprises a core with two wound legs and with a third leg comprising an auxiliary winding closed over a resistance. The third leg is arranged such that the common mode fluxes of the two phases sum up in the third leg such that the resistance in the auxiliary winding can damp the common mode noise current. However, this solution has the disadvantage that the third leg of the differential mode reactor core significantly increases the size of the reactor, in particular when applied to a three-phase system.

All current solutions for reducing the common mode noise currents in motor drives are bulky.

U.S. Pat. No. 3,863,109 discloses a solution for detecting directly in an inductor a short circuit to avoid further damages in other system elements. Therefore, the inductor has a sensing coil which detects a deviation of the symmetrical flux distribution to detect such a short circuit in the inductor. The sensing coil is connected to a relay which opens, when the flux distribution of the inductor gets unsymmetrical due to a short in the inductor. One embodiment discloses such a sensing coil for three-phase reactor. However, the sensing coil does not detect a system common mode noise current, in particular does not reduce this system common mode noise current.

BRIEF SUMMARY OF THE INVENTION

It is the object of the invention to find a simple, light and small solution for the reduction of common mode noise currents in motor drives.

The object is solved by the motor control, the three-phase differential mode filter and the three-phase differential mode reactor according to the independent claims.

By simply adding one auxiliary coil in the three-phase differential mode reactor, the common mode currents of the system are significantly reduced. The auxiliary coil requires almost no additional space, since it is wound around the core elements already necessary for the three differential mode inductor coils. No additional core elements like an extra common mode core leg is necessary. Therefore, the common mode currents can be significantly reduced without increasing the size and/or weight of the reactor, the filter and/or the motor control.

The dependent claims refer to further embodiments of the invention.

In one embodiment, the auxiliary coil is arranged in the reactor of the filter or the motor control with the largest inductance. The common mode currents are significantly influenced by the largest inductance of the system. By adding the auxiliary coil in the largest inductance, the common mode currents can be reduced most effectively. It is not necessary to include this coil also in the other smaller inductances (but obviously could be included therein as well).

In one embodiment, the auxiliary coil is arranged in the reactor of the filter being in the power line on the side of the connection point towards the converter. Preferably, this reactor is also the largest reactor of the filter and/or of the power line between the motor and the supply.

In one embodiment, the auxiliary coil is short circuited such that the common mode current induced in the auxiliary coil circulates in there and creates a counter common mode flux in the three wound core elements of the differential mode reactor which creates a counter common mode current in the respective three coils. This alone already reduces significantly the common mode currents of the system. Surprisingly a resistor (or other impedance element) for damping the common mode currents is not necessary in the auxiliary coil. This avoids further thermal hot spots in the reactor.

In one embodiment, the auxiliary coil is short circuited with an impedance. This allows to increase the common mode noise current damping effect. The impedance is preferably an ohmic resistor. However, the impedance can also or in addition be complex like a capacitor or an inductor or combination of those. The impedance or the resistor is preferably a discrete element, but could also be a parasitic impedance or resistance of the auxiliary coil.

In one embodiment, the auxiliary coil is wound such around the first, second and third core element that the common mode noise currents above 1 kHz are damped.

BRIEF DESCRIPTION OF THE DRAWINGS

The invention will be better understood with the aid of the description of an embodiment given by way of example and illustrated by the figures, in which:

FIG. 1 shows an embodiment of a motor drive system.

FIG. 2 shows an embodiment of a filter for a motor control of the motor drive system.

FIG. 3 shows the equivalent circuit of the common mode currents without a common mode damping in the differential mode reactor.

FIG. 4 shows the equivalent circuit of the common mode currents with a common mode damping in the differential mode reactor.

DETAILED DESCRIPTION OF POSSIBLE EMBODIMENTS OF THE INVENTION

Figure 5:
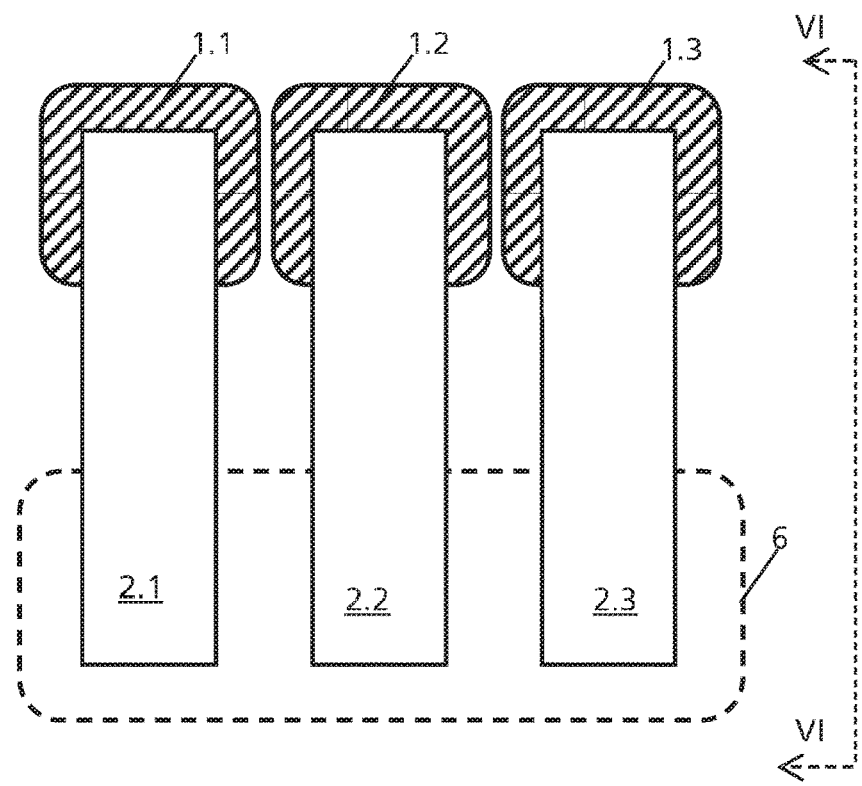
FIG. 5 shows a first embodiment of a three-phase differential mode reactor with common mode damping from a side view V-V indicated in FIG. 6.

FIG. 1 shows a motor drive system according to the invention. The motor drive system comprises a supply G, a motor control and a motor M.

The supply G is any three-phase AC current source, e.g. a three-phase AC network. The supply frequency is normally 50 Hz or 60 Hz, but could have also other supply frequencies.

The motor M is preferably a three-phase AC motor. The motor M is controlled and/or powered by the three-phase AC current or mains of the motor control. Therefore, the motor control is connected over the three-phase conductor or power line 16 with the motor M. The term motor shall include also a generator which is in principal a reversely operated motor. The example for such a motor drive system with a generator could be a wind turbine. The term motor shall include also a motor/generator which is sometimes operated as motor and sometimes as generator (e.g. during braking).

The motor control provides the necessary control and/or power for the motor M. In case of a generator as a motor, the motor control transfers the power from the generator M to the supply network G.

The motor control comprises an AC/AC converter 11 and at least one three-phase differential mode reactor with common mode damping according to the invention, preferably in a filter 12.

The AC/AC converter 11 converts the supply AC current into the motor AC current and/or vice versa. The AC/AC converter comprises preferably a rectifier (AC into DC), a DC-Link and an inverter (DC into AC). However, obviously other AC/AC converters 11 can be used. The AC/AC converter 11, in particular the inverter is a common source for (common mode) noise.

Preferably, the motor control comprises a three-phase differential mode filter 12. The filter 12 is arranged in the mains 15, 16 between the supply G and the motor M. Preferably, the filter 12 is arranged between the supply G and the AC/AC converter 11, i.e. between the supply side input of the motor control and the AC/AC converter 11. However, in another embodiment, the filter 12 can also be arranged between the motor M and the AC/AC converter 11, i.e. between the motor side input of the motor control and the AC/AC converter 11.

FIG. 2 shows an embodiment of the filter 12. The filter 12 has a supply side input and a motor side input connected over a three-phase conductor 15 configured to conduct the three-phase AC power between the supply G and the motor M or between the supply side input and a motor side input, respectively. Three capacitors 24 are connected in a star point and/or delta connection with the conductors 15 at a connection point 25 between the supply side input and the motor side input. FIG. 2 shows a star point connection. It is however clear to a person skilled in the art that the circuit can be equivalently changed into a corresponding delta connection without any change in the electrodynamical behaviour. The filter 12 comprises preferably one, even more preferably two and maybe also three of the following three three-phase differential mode reactors 21, 22 and 23: A first three-phase differential mode reactor 21 is arranged between the supply side input and the connection point. A second three-phase differential mode reactor 22 is arranged between the motor side input and the connection point. A third three-phase differential mode reactor 23 is arranged in the star point and/or delta connection with the connection points 25 (together with the capacitors 24). If the filter 12 comprises the third three-phase differential mode reactor 23 or other components in the star point and/or delta connection of the capacitors 24, a combined star point and delta connection is possible as well. Other components could be resistors in parallel to the capacitors 24. The star point is preferably not connected to earth. However, in some filters, the star point could be connected to earth (directly or over other components like a further earth capacitor). The filter 12 with the above described circuit or another circuit can be an LCL filter, an PHF filter, a line filter, a harmonics filter, an EMC filter, an input filter, an output filter. An LCL filter can be achieved with the first reactor 21 and the second reactor 22 (and without the third reactor 23). An output filter can be achieved with the third reactor 23 and the second reactor 22 (and without the first reactor 21).

The motor control can have further filters, like the EMC filter 13. The EMC filter 13 can be a LC filter with the inductors $L_{CM,F}$ in the mains and the capacitors $C_{CM,F}$ in the earth connection between the mains and earth. The EMC filter is preferably arranged between the supply G and the AC/AC converter 11.

The motor control, preferably the filter 12 comprises a three-phase differential mode reactor with a common mode damping as described in the following with the help of the embodiments shown in FIGS. 5 to 10. Preferably, the three-phase differential mode reactor with the common mode damping is arranged in the conductor 15 or 16 between the supply side input and the motor side input (thus preferably not in the third three-phase differential mode reactor 23). Preferably, the three-phase differential mode reactor with the common mode damping corresponds to the first or second reactor 21 or 22 of the filter 12. Preferably, the three-phase differential mode reactor with the common mode damping corresponds to the first or second reactor 21 or 22 of the filter 12 being on the side of the converter with respect to the connection points 25. Preferably, the three-phase differential mode reactor with the common mode damping is the reactor of the motor control or of the filter 12 or of the first and second reactor 21 and 22 with the largest inductance.

Figure 6:
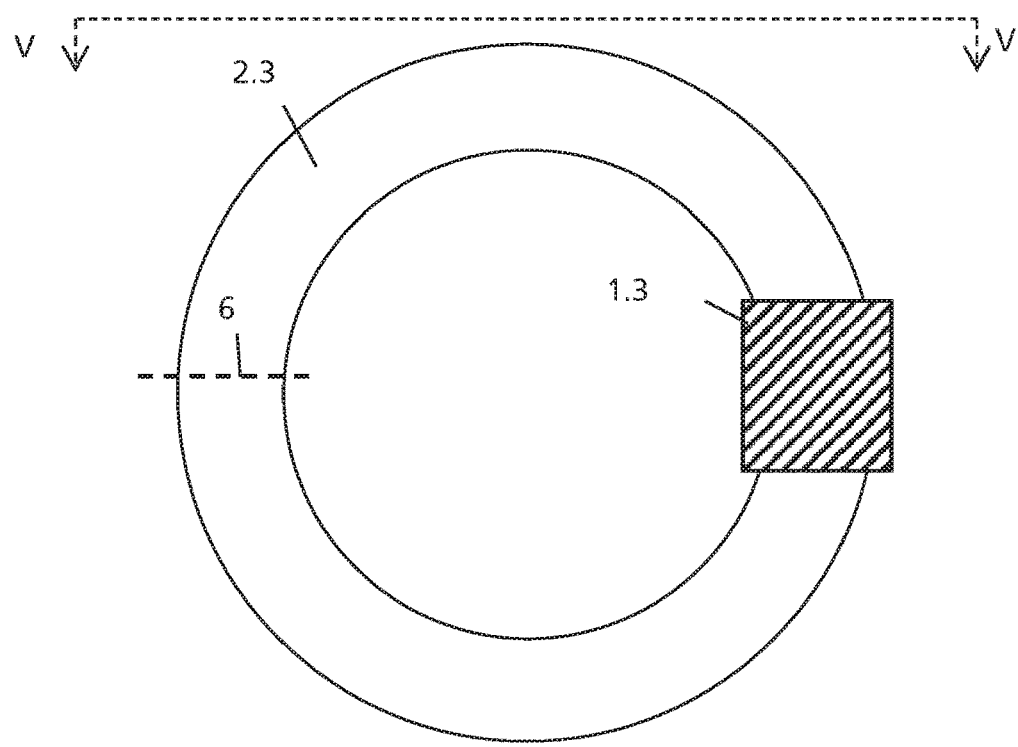
FIG. 6 shows the first embodiment of a three-phase differential mode reactor with common mode damping from a side view VI-VI indicated in FIG. 5.
Figure 7:
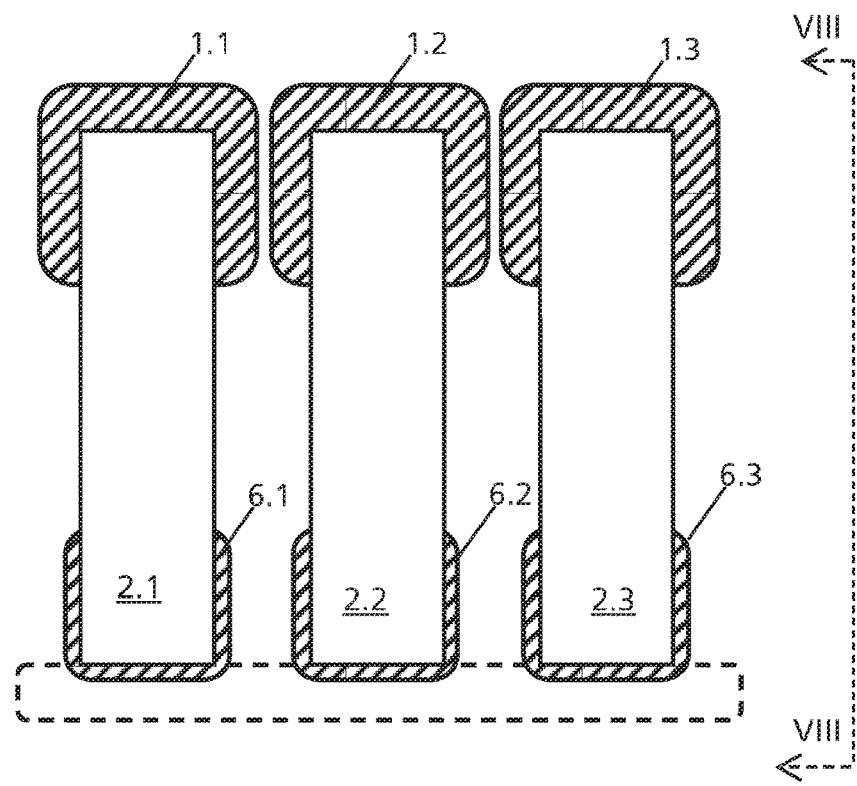
FIG. 7 shows a second embodiment of a three-phase differential mode reactor with common mode damping from a side view VII-VII indicated in FIG. 8.
Figure 8:
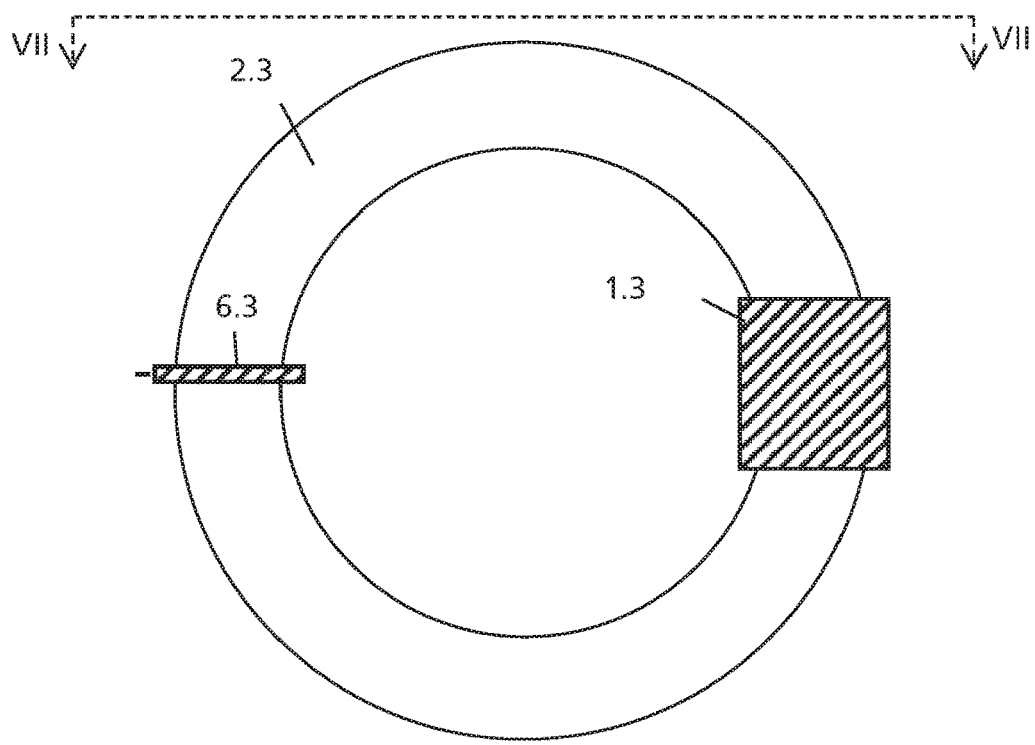
FIG. 8 shows the second embodiment of a three-phase differential mode reactor with common mode damping from a side view VIII-VIII indicated in FIG. 7.
Figure 9:
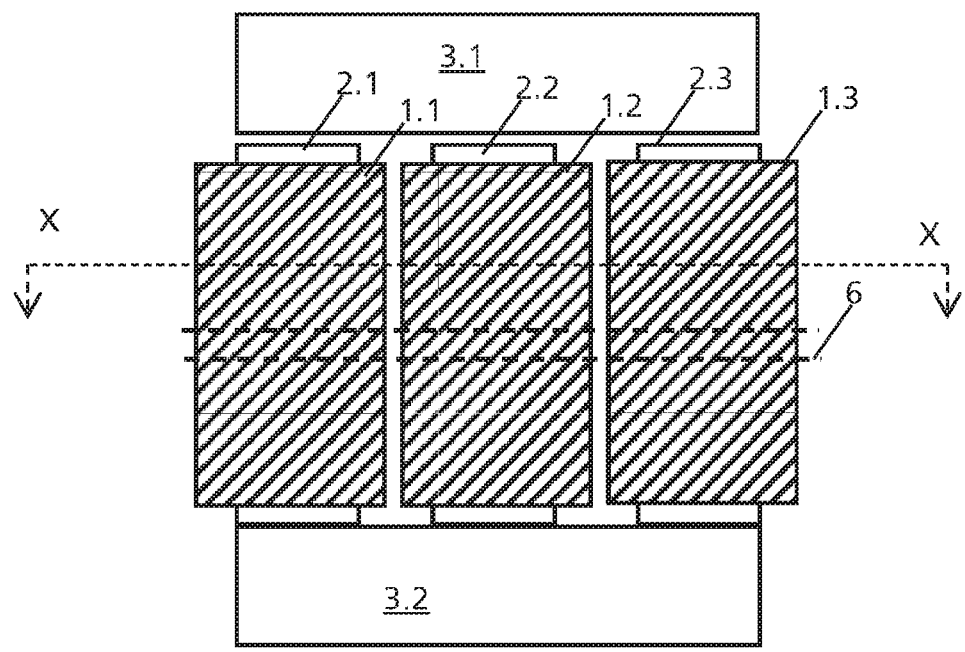
FIG. 9 shows a third embodiment of a three-phase differential mode reactor with common mode damping from a side view.
Figure 10:
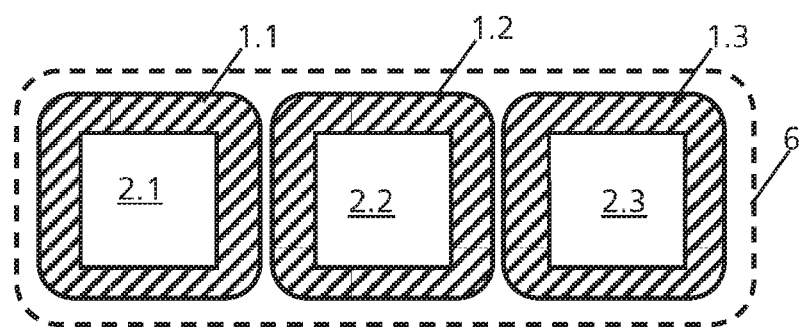
FIG. 10 shows the third embodiment of a three-phase differential mode reactor with common mode damping along the cross-sectional view X-X indicated in FIG. 9.

FIGS. 5 and 6 show a first embodiment of the three-phase differential mode reactor with the common mode damping. FIGS. 7 and 8 show a second embodiment of the three-phase differential mode reactor with the common mode damping. FIGS. 9 and 10 show a third embodiment of the three-phase differential mode reactor with the common mode damping. The three-phase differential mode reactor with the common mode damping comprises for a first phase a first core element 2.1 and a first coil 1.1, for a second phase a second core element 2.2 and a second coil 1.2 and for a third phase a third core element 2.3 and a third coil 1.3.

The first coil 1.1 is wound around the first core element 2.1. The first coil 1.1 is configured to conduct the current of the first phase (preferably from the supply to the motor). Preferably, one end of the first coil 1.1 is connected to a first input terminal of the reactor and the opposing end of the first coil 1.1 is connected to a first output terminal of the reactor. Thus, the current of the first phase can flow from the first input terminal through the first coil 1.1 to the first output terminal (or vice versa). The first coil 1.1 wound around the first core element 2.1 provides the first inductance of the reactor for the first phase.

The second coil 1.2 is wound around the second core element 2.2. The second coil 1.2 is configured to conduct the current of the second phase (preferably from the supply to the motor). Preferably, one end of the second coil 1.2 is connected to a second input terminal of the reactor and the opposing end of the second coil 1.2 is connected to a second output terminal of the reactor. The terms input and output shall not indicate any direction of the current. Thus, the current of the second phase can flow from the second input terminal through the second coil 1.2 to the second output terminal (or vice versa). The second coil 1.2 wound around the second core element 2.2 provides the second inductance of the reactor for the second phase.

The third coil 1.1 is wound around the third core element 2.1. The third coil 2.1 is configured to conduct the current of the third phase (preferably from the supply to the motor). Preferably, one end of the third coil 1.1 is connected to a third input terminal of the reactor and the opposing end of the third coil 1.1 is connected to a third output terminal of the reactor. The terms input and output shall not indicate any direction of the current. Thus, the current of the third phase can flow from the third input terminal through the third coil 1.1 to the third output terminal (or vice versa). The third coil 1.3 wound around the third core element 2.3 provides the third inductance of the reactor for the third phase.

In the following some terms shall be clarified. The terms "input terminal" and "output terminal" shall not indicate any direction of the current. The term "terminal" is preferably a means for fixing a cable or conductor like a clamp, a screw or a soldering spot. However, the terminal can also be a continuous connection of a cable or conductor to the respective coil. The terms "common mode" and "differential mode" shall be shortly explained. The current flowing in the three phases of the motor drive system, of the motor control, the filter 12 and/or of the reactor consists of common mode currents and differential mode currents. The "differential mode currents" are the currents summing up in all phases to zero. The used power of an AC current is a differential mode current. However, only the AC current at the used power frequency 50 Hz or 60 Hz) is desired. The remaining differential mode currents are considered as "differential mode noise currents". Those appear in particular at higher frequencies and are filtered with respective filters like harmonics filters, EMC filters, input filters, etc. The remaining currents on the three phases which do not sum up to zero are the "common mode currents" which "travel" on the mains in a common direction (to the motor M or the supply G). The common mode currents flow then back over earth. The common mode currents are normally not desired and are also called common mode noise currents. The common mode noise currents comprise often <<common mode ringing noise currents>> which include the higher harmonics of the common mode noise currents and/or which include the common mode noise currents above 1 Kilohertz (kHz).

The three core elements 2.1, 2.2 and 2.3 can be part of the same core as in shown in the third embodiment or of separate cores as in the first and second embodiment. The use of three separate ring formed cores as in the first and the second embodiment has shown particular advantageous for the reactor of the present invention with common mode damping. The ring formed core is preferably closed, thus without an air gap. The outer and/or inner form of the ring is preferably circular (as shown in FIGS. 6 and 8). However, other ring forms are possible as a triangular, a rectangular, a n-angle, etc. The cross-sectional form of the ring is preferably rectangular (maybe with rounded edges) as shown in FIGS. 5 and 7. However, it is also possible to have other forms of the cross-section of the ring, like a circular cross-section (yielding in combination with the circular formed ring a torus). However, it is also possible to use other formed separate cores as an I-core, a C-core, an E-core, an E-I core, etc. The three core elements 2.1, 2.2 and 2.3 can also be part of the same core as shown for example in the third embodiment. Herein, each core element 2.1, 2.2, 2.3 corresponds to a wound limb of the core. The three wound limbs are connected by at least a first yoke. In the shown embodiment, the three wound limb are connected by a first yoke (connected to the wound legs without airgap) and a second yoke (connected to the wound legs with airgap). Obviously, many other designs of a common core for the three core elements 2.1, 2.2 and 2.3 are possible.

The three coils 1.1, 1.2, 1.3 are wound such around the core elements 2.1, 2.2, 2.3 that the first coil 1.1 wound around the first core element 2.1 damps the differential mode noise current in the first phase, i.e. flowing through the first coil 1.1, that the second coil 1.2 wound around the second core element 2.2 damps the differential mode noise current in the second phase, i.e. flowing through the second coil 1.2 and that the third coil 1.3 wound around the third core element 2.3 damps the differential mode noise current in the third phase, i.e. flowing through the third coil 1.3. The three coils 1.1, 1.2, 1.3 are wound such on the three core elements 2.1, 2.2, 2.3 that the first differential mode magnetic flux created by the differential mode currents flowing through the first coil 1.1 is not compensated in the first core element 2.1 by the (second and third) differential mode fluxes created by the other two coils 1.2, 1.3 in the first core element 2.1 (contrary to a current compensated common mode choke). The same holds for the second and third coil 1.2 and 1.3. Consequently, the first differential mode magnetic flux induces a first counter differential mode noise current in the first coil 1.1 to reduce the differential mode noise current flowing through the first coil 1.1.

According to the invention, the three-phase differential mode reactor comprises an auxiliary coil. Preferably, the auxiliary coil is wound such around the first core element 2.1, the second core element 2.2 and the third core element 2.3 that a common mode current flowing through the first phase, the second phase and the third phase is induced in the auxiliary coil. This can be achieved either by a girdle or common coil 6 enclosing (in each loop of each winding of the girdle or common coil) all three core elements 2.1, 2.2, 2.3 as shown in the first and third embodiment or by combination of a first sub auxiliary coil 6.1 wound around the first core element 2.1, a second sub auxiliary coil 6.2 wound around the second core element 2.2 and a third sub auxiliary coil 6.3 wound around the third core element 2.3 as shown in the second embodiment. The three sub auxiliary coils 6.1, 6.2 and 6.3 are preferably serially connected to each other. The number of windings of the auxiliary coil, i.e. of the girdle coil 6 or of each sub auxiliary coil 6.1, 6.2, 6.3 can be any, but preferably is lower than 10, preferably than 5, preferably than 3. Preferably, the number of windings of the auxiliary coil is at least one full winding.

Preferably, the auxiliary coil 6 or 6.1, 6.2, 6.3 is wound such around the first core element 2.1, the second core element 2.2 and the third core element 2.3 that the first common mode flux created by the common mode current flowing through the first phase or first coil 1.1, the second common mode flux created by the common mode current flowing through the second phase or the second coil 1.2 and the third common mode flux created by the common mode current flowing through the third phase or the third coil 1.3 induces a resulting (non-zero) common mode current in the auxiliary coil 6 or 6.1, 6.2, 6.3. Preferably, the same common mode current contribution is induced in the auxiliary coil 6 or 6.1, 6.2, 6.3 by each coil 1.1, 1.2 and 1.3. The auxiliary coil 6 or 6.1, 6.2, 6.3 is short circuited. The common mode current induced in the auxiliary coil 6 or 6.1, 6.2, 6.3 creates a counter common mode flux which is induced back in the three coils 1.1, 1.2, 1.3 where it compensates or damps the common mode currents. The auxiliary coil 6 or 6.1, 6.2, 6.3 is wound around a position of the first core element 2.1, the second core element 2.2 and the third core element 2.3 where the same common mode flux is created by the same common mode current flowing through the respective coil 1.1, 1.2, 1.3. For the ring formed core elements, this is every position around the ring. Preferably, the auxiliary coil 6 or 6.1, 6.2, 6.3 is wound around a position of the first core element 2.1, the second core element 2.2 and the third core element 2.3 where the respective common mode flux of the respective phase or coil is maximal and/or not divided in the core-flux path. For the ring formed core elements, this is every position around the ring.

In the embodiments with a girdle coil 6, the first common mode flux, the second common mode flux and the third common mode flux enclosed together in the girdle coil 6 sum up or integrate to a resulting common mode flux. The resulting common mode flux induces then a resulting common mode current in the girdle coil 6. The counter common mode current in the girdle coil 6 creates a counter common mode flux which creates a respective counter common mode current in the three coils 1.1, 1.2 and 1.3 which damps the common mode current in each coil 1.1, 1.2, 1.3. Each winding of the girdle coil 6 encloses thus all three core elements 2.1, 2.2 and 2.3. The embodiment of the girdle coil 6 has the advantage that the construction of existing differential mode three-phase reactors must not be changed. The girdle coil 6 can be added simply at the end of the manufacturing process or even retrofitted later. Preferably, the girdle coil 6 is isolated and/or kept in position by the potting of the three-phase reactor.

In the embodiments with sub auxiliary coils 6.1, 6.2, 6.3, the first common mode flux induces a first common mode current in the first sub auxiliary coil 6.1, the second common mode flux induces a second common mode current in the second sub auxiliary coil 6.2 and the third common mode flux induces a third common mode current in the third sub auxiliary coil 6.3. The sub auxiliary coils 6.1, 6.2, 6.3 are combined such that the first common mode current in the first sub auxiliary coil 6.1, the second common mode current in the second sub auxiliary coil 6.2 and the third common mode current in the third sub auxiliary coil 6.3 are combined, preferably sum up to a resulting common current of the auxiliary coil 6.1, 6.2, 6.3. The resulting common mode current in the auxiliary coil 6.1, 6.2, 6.3 creates then a first counter common mode flux in the first core element 2.1 via the first sub auxiliary coil 6.1, a second counter common mode flux in the second core element 2.2 via the second sub auxiliary coil 6.2 and a third counter common mode flux in the third core element 2.3 via the third sub auxiliary coil 6.3. The first counter common mode flux induces a first counter common mode current in the first coil 1.1 for damping the common mode current in there. The second counter common mode flux induces a second counter common mode current in the second coil 1.2 for damping the common mode current in there. The third counter common mode flux induces a third counter common mode current in the third coil 1.3 for damping the common mode current in there.

The effect of the common mode damping can be increased by closing or short-circuiting the auxiliary coil 6 or 6.1, 6.2, 6.3 over an impedance. The impedance is preferably an ohmic resistor. However, the impedance can also or in addition be complex like a capacitor or an inductor or combination of those. The impedance or the resistor is preferably a discrete element, but could also be a parasitic impedance or resistance of the auxiliary coil. The discrete element has the disadvantage that it creates a hot spot. It was found out that the effect of the common mode damping is strong enough without such a resistor.

FIG. 3 shows an equivalent circuit of the common mode currents in the motor drive system without the common mode damping in the three-phase differential mode reactor. The common mode currents flow over the three phases from the supply G to the motor M and back over earth (or in opposed direction). The behaviour of the common mode currents is defined by the inductances of the motor drive system $L_{CM}$ and its capacitances to earth $C_{CM}$. The capacitances to earth are for example the motor capacitance $C_{CM,M}$, the converter capacitances $C_{CM,RI}$ and the EMC filter capacitances $C_{CM,F}$ as shown in FIG. 1. The common mode noise damping factor for the motor drive system is proportional to $$\sqrt{\frac{C_{CM}}{L_{CM}}}.$$

Figure 11:
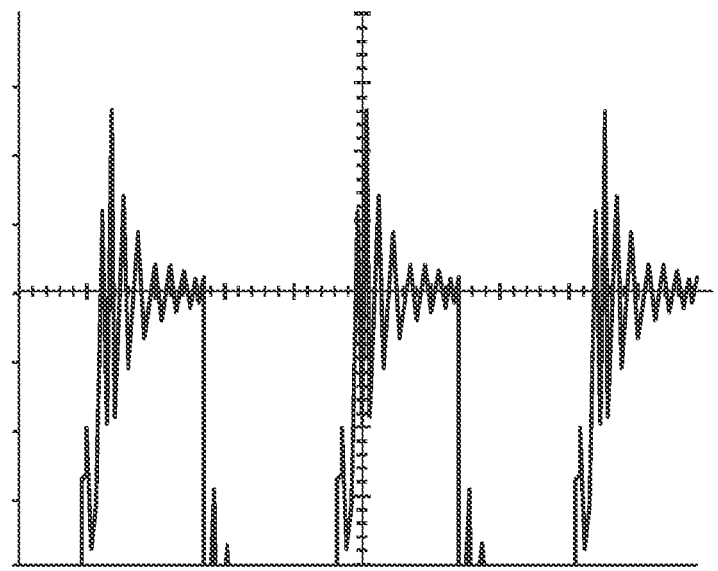
FIG. 11 shows the common mode noise without the three-phase differential mode reactor with common mode damping.

Consequently, in the state of the art, large inductances of the differential mode filtering contributed to a small common mode damping factor. This leads in particular to common mode ringing noise currents in higher frequencies which are not damped as seen in FIG. 11. FIG. 11 shows the common mode currents in the motor drive, in the filter 12 and/or in the reactor without common mode damping.

FIG. 4 shows now the effect of the common mode damping in the three-phase differential mode reactor. The effective common mode inductance is reduced such that the common mode noise damping factor is increased by $$\sqrt{\frac{C_{CM}}{L_{CM} - L'_{CM}}}.$$

Figure 12:
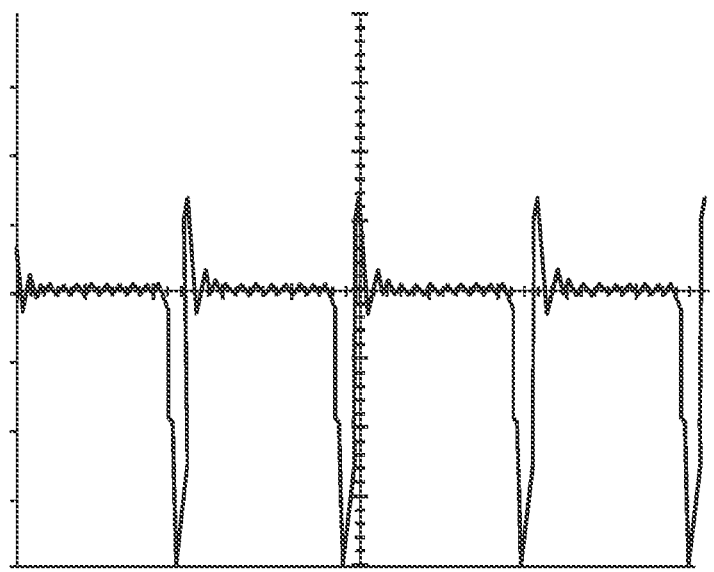
FIG. 12 shows the common mode noise with the three-phase differential mode reactor with common mode damping.

FIG. 12 shows the common mode currents in the motor drive, in the filter 12 and/or in the reactor with common mode damping. As seen in FIG. 12, the common mode noise ringing currents are damped significantly compared to FIG. 11. Consequently, the minimal change of the construction of the reactor by an auxiliary coil for damping the common mode noise, leads to a significant reduction of the common mode ringing noise currents.

The three-phase differential mode filter 12 and/or the three-phase differential mode reactor with common mode damping was described in a motor control of a motor drive system. However, the three-phase differential mode filter 12 and/or the three-phase differential mode reactor with common mode damping can be used in any other control or converter circuit. Preferably, such a control or converter circuit comprises at least one converter, e.g. an inverter, and at the three-phase differential mode filter 12 and/or the three-phase differential mode reactor with common mode damping. In this case, the supply side input of the filter 12 or of the reactor can be considered in general as first side input and the motor or converter side input of the filter 12 or of the reactor can be considered in general as second side input. The three-phase differential mode reactor is preferably used to filter differential mode noise currents (in a specific frequency range), i.e. to damp the differential mode noise currents. However, the three-phase differential mode reactor could also be used in other applications to (significantly) form or process the differential mode currents. Damping is one preferred form of forming or processing the differential mode currents. An alternative processing could be integrating the differential mode currents.

The invention claimed is:

1. Three-phase differential mode filter for a motor drive system having a first phase, a second phase, and a third phase, comprising for each one of the three phases a supply side input, a motor side input, a conductor between the supply side input and the motor side input for conducting a current of the motor drive between a supply and a motor, a connection point in the conductor, wherein the three-phase differential mode filter comprises three capacitors connected in a star point and/or delta connection with the connection points of the conductors of the first phase, second phase and third phase, wherein the three-phase differential mode filter comprises at least two of a first three-phase differential mode reactor between the supply side input and the connection point, a second three-phase differential mode reactor between the motor side input and the connection point, and a third three-phase differential mode reactor connected via a star point and/or delta connection with the connection points, wherein one of the at least two three-phase differential mode reactors is a common mode compensating three-phase differential mode reactor with:
a first core element;
a second core element;
a third core element;
a first coil wound around the first core element for conducting the current of a first phase and for damping a differential mode noise currents in the first phase;
a second coil wound around the second core element for conducting the current of a second phase and for damping a differential mode noise currents in the second phase;
a third coil wound around the third core element for conducting the current of a third phase and for damping a differential mode noise currents in the third phase; and
wherein the common mode compensating three-phase differential mode reactor comprises an auxiliary coil wound such around the first core element, the second core element and the third core element that a common mode current in the first phase, the second phase and the third phase is induced in the auxiliary coil.

2. Filter according to claim 1, wherein the auxiliary coil is wound such around the first core element, the second core element and the third core element that the differential mode components of the first phase, the second phase and the third phase cancel each other out in the auxiliary coil.

3. Filter according to claim 1, wherein the common mode current through the first coil creates a first common mode magnetic flux in the first core element, wherein the common mode current through the second coil creates a second common mode magnetic flux in the second core element, wherein the common mode current through the third coil creates a third common mode magnetic flux in the third core element, wherein the auxiliary coil is wound such around the first core element, the second core element and the third core element that the first, second and third common mode magnetic flux sum up in the auxiliary coil.

4. Filter according to claim 1, wherein a first end of the auxiliary coil is connected directly or via an impedance with a second end of the auxiliary coil.

5. Filter according to claim 1, wherein the auxiliary coil comprises a girdle coil wound such around the first core element, the second core element and the third core element that it encloses the first core element, the second core element and the third core element in a same loop or coil.

6. Filter according to claim 1, wherein the auxiliary coil comprises a first sub auxiliary coil wound around the first core element, a second sub auxiliary coil wound around the second core element and a third sub auxiliary coil wound around the third core element, wherein a first end of the auxiliary coil corresponds to a first end of the first sub auxiliary coil, wherein a second end of the first sub auxiliary coil is connected to a first end of the second sub auxiliary coil, wherein a second end of the second sub auxiliary coil is connected to a first end of the third sub auxiliary coil, wherein a second end of the auxiliary coil corresponds to a second end of the third sub auxiliary coil.

7. Filter according to claim 1, wherein the first core element is a first wound leg of a three-phase core, the second core element is a second wound leg of the three-phase core and the third core element is a third wound leg of three-phase core, wherein the three-phase core comprises at least one yoke connecting the first, second and third wound leg.

8. Filter according to claim 1, wherein the first core element, the second core element and the third core element are three separate cores.

9. Filter according to claim 8, wherein each of three separate cores has a ring form.

10. Filter according to claim 1, wherein the common mode compensating three-phase differential mode reactor has a first inductance, wherein the filter has other differential mode reactors that have other inductances, the first inductance being larger than the other inductances.

11. Filter according to claim 1, wherein the auxiliary coil is wound such around the first core element, the second core element and the third core element that the common mode current in the first phase, the second phase and the third phase is damped by the auxiliary coil (6; 6.1, 6.2, 6.3) in the frequency range above one Kilohertz.

12. Motor control comprising a filter according to claim 1 and an AC-AC converter for converting the supply current into the motor current.

13. Motor control according to claim 12, wherein the filter is arranged between a supply side and the AC-AC converter.

14. Three-phase differential mode reactor with a first phase, a second phase, and a third phase, the reactor comprising:
   a first core element;
   a second core element;
   a third core element;
   a first coil wound around the first core element for conducting a current of the first phase and for damping a differential mode noise currents in the first phase;
   a second coil wound around the second core element for conducting a current of the second phase and for damping a differential mode noise currents in the second phase;
   a third coil wound around the third core element for conducting the current of the third phase and for damping a differential mode noise currents in the third phase;
   an auxiliary coil wound such around the first core element, the second core element and the third core element that a common mode current in the first phase, the second phase and the third phase is induced in the auxiliary coil.

15. Reactor according to claim 14, either
   wherein the auxiliary coil comprises a girdle coil wound such around the first core element, the second core element and the third core element that it encloses the first core element, the second core element and the third core element in a same loop or coil; or
   wherein the auxiliary coil comprises a first sub auxiliary coil wound around the first core element, a second sub auxiliary coil wound around the second core element and a third sub auxiliary coil wound around the third core element, wherein a first end of the auxiliary coil corresponds to a first end of the first sub auxiliary coil, wherein a second end of the first sub auxiliary coil is connected to a first end of the second sub auxiliary coil, wherein a second end of the second sub auxiliary coil is connected to a first end of the third sub auxiliary coil, wherein a second end of the auxiliary coil corresponds to a second end of the third sub auxiliary coil.

* * * * *